(12) United States Patent
Twyford et al.

(10) Patent No.: US 12,110,139 B2
(45) Date of Patent: Oct. 8, 2024

(54) AIR SCOOP SOLAR SHIELD FOR UAV

(71) Applicant: WING Aviation LLC, Mountain View, CA (US)

(72) Inventors: Evan Twyford, Houston, TX (US); Ivan Qiu, Redwood City, CA (US); James Juma, Fremont, CA (US)

(73) Assignee: Wing Aviation LLC, Palo Alto, CA (US)

( * ) Notice: Subject to any disclaimer, the term of this patent is extended or adjusted under 35 U.S.C. 154(b) by 145 days.

(21) Appl. No.: 17/541,944

(22) Filed: Dec. 3, 2021

(65) Prior Publication Data

US 2023/0174232 A1 Jun. 8, 2023

(51) Int. Cl.
| | |
|---|---|
| *B64U 20/92* | (2023.01) |
| *B60L 53/00* | (2019.01) |
| *B64C 29/00* | (2006.01) |
| *B64U 10/20* | (2023.01) |
| *B64U 20/96* | (2023.01) |

(Continued)

(52) U.S. Cl.
CPC ............. *B64U 20/92* (2023.01); *B60L 53/00* (2019.02); *B64C 29/0025* (2013.01); *B64U 20/96* (2023.01); *B64U 30/40* (2023.01); *B60L 2200/10* (2013.01); *B64U 10/20* (2023.01); *B64U 50/13* (2023.01)

(58) Field of Classification Search
CPC .... B64C 1/38; B64C 1/26; B64C 5/02; B64U 20/92; B64U 20/96; B64U 30/40; B64D 13/006; B64D 2013/0614; B64D 2033/024
See application file for complete search history.

(56) References Cited

U.S. PATENT DOCUMENTS

| | | | |
|---|---|---|---|
| 3,783,935 A | | 1/1974 | Simmons et al. |
| 4,233,773 A | * | 11/1980 | Jones ..................... A63H 27/02 446/34 |

(Continued)

FOREIGN PATENT DOCUMENTS

| | | |
|---|---|---|
| CN | 110401001 A | 11/2019 |
| WO | 2021046527 A1 | 3/2021 |

OTHER PUBLICATIONS

International Search Report and Written Opinion, issued Jan. 20, 2023, in corresponding International Patent Application No. PCT/US2022/045894, 14 pages.

(Continued)

*Primary Examiner* — Richard Green
*Assistant Examiner* — Ashesh Dangol
(74) *Attorney, Agent, or Firm* — Christensen O'Connor Johnson Kindness PLLC (57) ABSTRACT

An unmanned aerial vehicle (UAV) includes a fuselage, electronics disposed with the fuselage, a heat sink, and a solar shield. The heat sink is thermally connected to the electronics and includes a cooling plate disposed on or extends through an exterior surface of the fuselage. The cooling plate is exposed to an external environment of the UAV to conduct heat from the electronics to the external environment via convection. The solar shield extends over the cooling plate and defines an air scoop within which the cooling plate is disposed. The air scoop directs airflow from the external environment across the cooling plate. The solar shield shades the cooling plate from solar radiation to prevent or reduce solar heating of the cooling plate.

14 Claims, 10 Drawing Sheets

(51) Int. Cl.
    *B64U 30/40*         (2023.01)
    *B64U 50/13*         (2023.01)

(56) References Cited

U.S. PATENT DOCUMENTS

| | | | |
|---|---|---|---|
| RE31,591 E * | 5/1984 | Drakeley | B64D 33/04 |
| | | | 244/50 |
| 9,429,076 B2 | 8/2016 | Smith et al. | |
| 9,669,936 B1 | 6/2017 | Fiterman et al. | |
| 2009/0084889 A1 * | 4/2009 | Cazals | B64C 5/06 |
| | | | 244/129.1 |
| 2016/0272316 A1 * | 9/2016 | Nelson | B64C 39/024 |
| 2017/0113778 A1 * | 4/2017 | Liu | B64C 39/024 |
| 2019/0033932 A1 * | 1/2019 | Ku | B64D 13/006 |
| 2019/0106192 A1 * | 4/2019 | Woodworth | B64C 29/0025 |
| 2019/0384288 A1 | 12/2019 | Gu | |
| 2020/0102061 A1 | 4/2020 | Cai et al. | |
| 2022/0340286 A1 * | 10/2022 | Jung | B64C 11/00 |

OTHER PUBLICATIONS

Cessna Skymaster, Wikipedia Article, https://en.wikipedia.org/w/index.php?title=Cessna_Skymaster&oldid=1044502899, Sep. 15, 2021, 9 pages.

Colomban Cri-cri, Wikipedia Article, https://en.wikipedia.org/w/index.php?title=colomban_cri-cri&oldid=1034651528, Jul. 21, 2021, 4 pages.

* cited by examiner

AIR SCOOP SOLAR SHIELD FOR UAV

TECHNICAL FIELD

This disclosure relates generally to unmanned aerial vehicles, and in particular but not exclusively, relates to heat management for unmanned aerial vehicles.

BACKGROUND INFORMATION

Modern unmanned aerial vehicles (UAVs) carry powerful electronics supporting ever increasing capabilities. These electronics include general purpose processors, avionics, control systems, power regulation and storage subsystems, sensors, etc. All of these systems generate heat and many are critical to successful UAV operation. As such, integrating thermal management subsystems into the structural design choices of a UAV is of increasing concern and importance.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Embodiments of an apparatus, system and method of operation for an unmanned aerial vehicle (UAV) including a heat sink for cooling onboard electronics, which heat sink includes a cooling plate covered by a solar shield defining an air scoop are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

There is a need to provide thermal management (e.g., cooling) to the increasingly powerful on-board electronics of UAVs. The techniques described herein integrated a thermal management subsystem into the design and architecture of the UAV. In particular, various embodiments integrate a heat sink with a cooling plate onto (or extending through) the exterior surface of the fuselage of the UAV. The cooling plate provides convective cooling to the exterior environment. The cooling plate is protected from deleterious solar heating using a solar shield. The solar shield shades the cooling plate from solar radiation incident from above and thereby prevents or reduces solar heating of the cooling plate and heat sink itself, which would otherwise reduce its cooling efficacy. In various embodiments, the solar shield is shaped and position on the fuselage to operate as an air scoop to further improve convective heat transfer to the external or ambient environment by directing and/or concentrating airflow across the cooling plate. The solar shield may also be adapted to serve as a mount or mounting bracket for various tail assemblies. These tail assemblies may include horizontal, vertical, or oblique stabilizers, which often protrude significantly out from the fuselage. By configuring the solar shield as a removeable mounting bracket, the UAV can be quickly and easily broken down into a more compact form factor for transporting.

Figure 1:
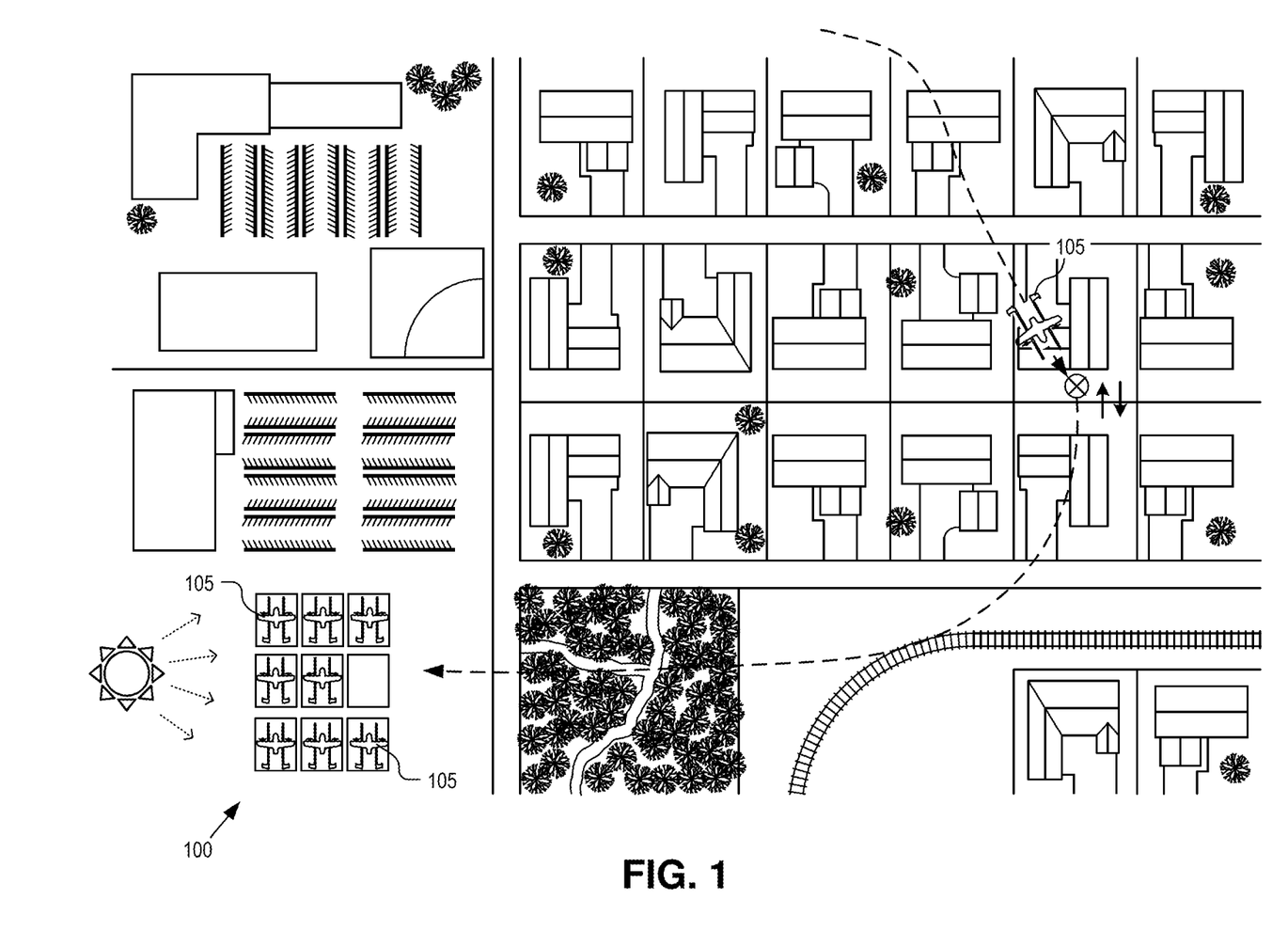
FIG. 1 illustrates unmanned aerial vehicles (UAVs) staged at a terminal area for servicing a neighborhood, in accordance with an embodiment of the disclosure.

UAVs may be provisioned to perform a variety of different mission types, including package delivery, aerial photography, public safety, etc. These UAVs may stage from an operations facility close to the neighborhood being served by a fleet of UAVs. FIG. 1 illustrates an example terminal area 100 staging a plurality of UAVs, such as UAVs 105, for servicing a nearby neighborhood. Many of these facilities are outdoor and exposed to the elements (e.g., direct sunlight). Often times, a fleet of UAVs 105 is deployed to outdoor staging/charging pads each morning and remain outside exposed to intense sun for the duration of the day. During the summer, or for geographic regions closer to the equator, the incident solar rays can impart significant solar heating to the UAVs, and particularly so to subsystems disposed on the topside of UAVs 105 that are directly exposed to solar radiation. When deployed to the staging pads, the UAVs may be charged while waiting on the staging pads to ensure they are/remain mission ready over the course of the day. In other words, the staging pads may also operate as charging pads. The act of charging itself can significantly raise the temperature of internal electronics (e.g., battery, power regulation electronics, etc.) in addition to potential solar heating that may occur while exposed to direct sunlight. As such, thermal management is not only important while UAVs are underway, but can also be a concern while the UAVs are parked and charging on their staging pads in terminal area 100.

Figure 2A:
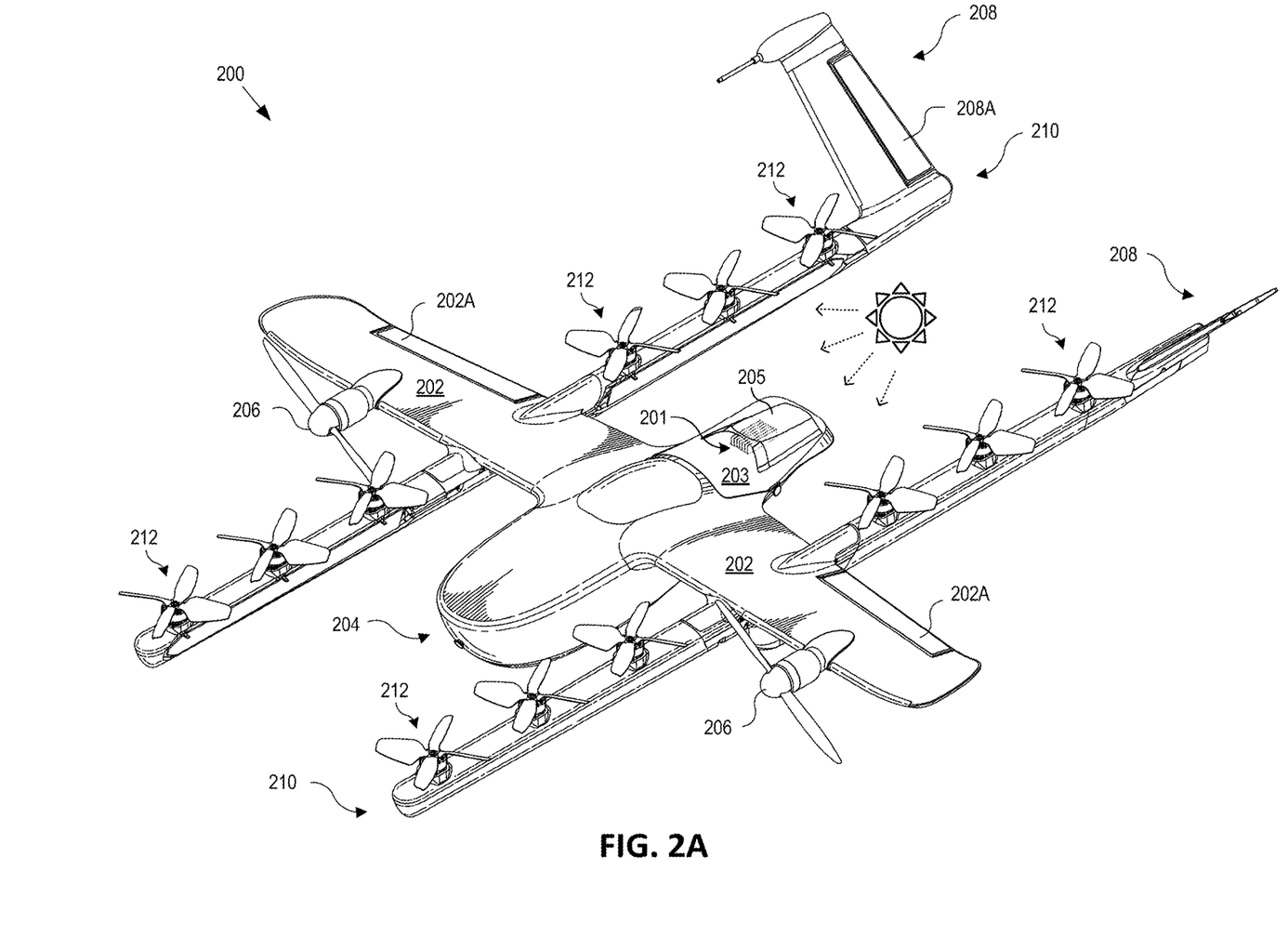
FIGS. 2A and 2B illustrate different views of an UAV including a cooling plate disposed within an air scoop defined by a solar shield, in accordance with an embodiment of the disclosure.
Figure 2B:
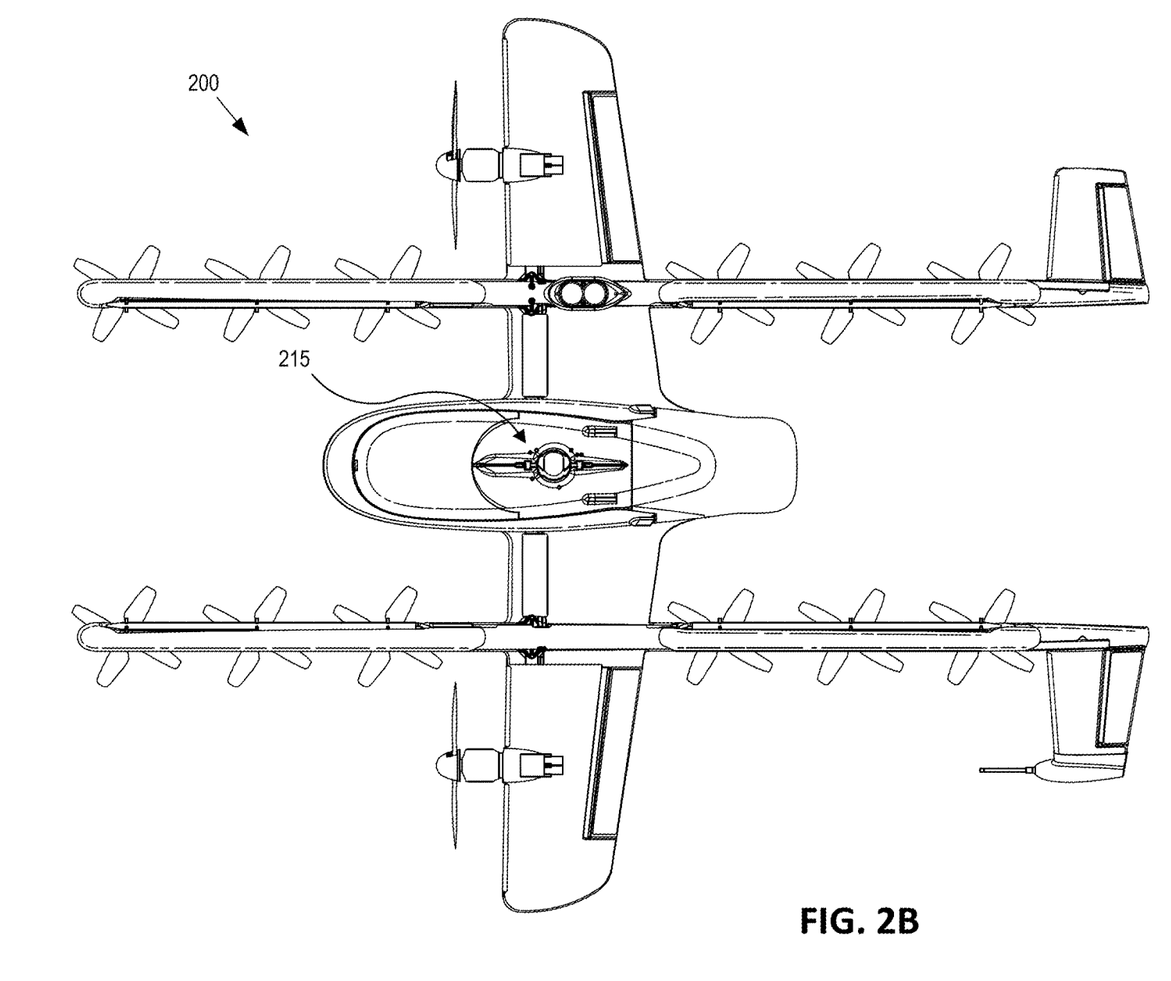

FIGS. 2A and 2B illustrate an UAV 200 that is well suited for various types of UAV missions including package delivery, aerial photography, public safety, or otherwise, in accordance with an embodiment of the disclosure. FIG. 2A is a topside perspective view illustration of UAV 200 while FIG. 2B is a bottom side plan view illustration of the same. UAV 200 is one possible implementation of UAVs 105 illustrated in FIG. 1, although other types of UAVs may be implemented as well.

The illustrated embodiment of UAV 200 is a vertical takeoff and landing (VTOL) UAV that includes separate propulsion units 206 and 212 for providing horizontal and vertical propulsion, respectively. UAV 200 is a fixed-wing aerial vehicle, which as the name implies, has a wing assembly 202 that can generate lift based on the wing shape and the vehicle's forward airspeed when propelled horizontally by propulsion units 206. The illustrated embodiment of UAV 200 has an airframe that includes a fuselage 204 and wing assembly 202. In one embodiment, fuselage 204 is modular and includes a battery module, an avionics module, and a mission payload module. These modules are secured together to form the fuselage or main body and collectively house the UAV's electronics.

The battery module (e.g., fore portion of fuselage 204) includes a cavity for housing electronics including one or more batteries for powering UAV 200. The avionics module (e.g., aft portion of fuselage 204) houses various electronics including flight control circuitry of UAV 200, which may include a processor and memory, communication electronics and antennas (e.g., cellular transceiver, wife transceiver, etc.), and various sensors (e.g., global positioning sensor, an inertial measurement unit, a magnetic compass, a radio frequency identifier reader, etc.) and even power electronics for charging the battery in the fore portion of fuselage 204. The mission payload module (e.g., middle portion of fuselage 204) houses equipment associated with a mission of UAV 200. For example, the mission payload module may include a payload actuator 215 (see FIG. 2B) for holding and releasing an externally attached payload (e.g., package for delivery). In some embodiments, the mission payload module may include camera/sensor equipment (e.g., camera, lenses, radar, lidar, pollution monitoring sensors, weather monitoring sensors, scanners, etc.).

UAV 200 includes a heat sink having a cooling plate 201 disposed on or extending through an exterior surface 203 of fuselage 204 and is covered by a solar shield 205. In the illustrated embodiment, exterior surface 203 is a topside in an aft section of fuselage 204. Of course, in other embodiments, the exterior surface may be located in other sections (e.g, fore or middle section of fuselage 204) or other sides (e.g., side or bottom of fuselage 204). The heat sink may include internal heat transfer elements to conduct heat from the electronics generating the heat to cooling plate 201 where the heat is dissipated to the ambient environment via convection and potentially secondarily also via radiation to the environment or conduction to fuselage 204. The internal heat transfer element may include heat pipes, fans, thermally conductive blocks or rods, etc. Cooling plate 201 thermally couples to the interior heat transfer elements and/or directly to the interior electronics and may assume a variety of form factors. In the illustrated embodiment, cooling plate 201 includes cooling fins stacked side-by-side that extend into a shaded recess or cavity defined by solar shield 205. The cooling fins provide increased surface area for convective heat transfer and the cooling fins align substantially parallel to the direction of airflow during forward cruise of UAV 200 to reduce drag and increase air mass flowing directly across the cooling surfaces. In some embodiments, an electric fan may be integrated into the airduct/air scoop formed by solar shield 205 to provide available on-demand, active convention cooling even when UAV 200 is not flying (e.g., parked on the ground charging). In other embodiments, cooling plate 201 may assume other form factors including a single flat plate, multiple vertically stacked plates, multiple laterally stacked plate (illustrated), or otherwise.

Solar shield 205 operates to shade cooling plate 201 and reduce solar heating of cooling plate 201 due to directly incident solar radiation from above UAV 200. Direct solar heating of cooling plate 201 reduces the cooling efficacy of the heat sink and could even lead to inverse operation where cooling plate 201 is heating interior electronics when exposed to intense sunshine. Solar shield 205 also defines an air scoop or airduct that directs or guides airflow over cooling plate 201 for improved convective heat transfer to the ambient environment. Solar shield 205 may define an air scoop shaped to reduce or minimize drag while allowing airflow through the airduct. In one embodiment, the leading and trailing areas defined by the air scoop formed by solar shield 205 have substantially equal cross-sectional areas. In other embodiments, solar shield 205 may define an air scoop that constricts or accelerates airflow by having a larger leading edge cross-sectional area than the trailing edge cross-sectional area.

Solar shield 205 may be fabricated using a variety of different materials capable of casting shade onto cooling plate 201. In various embodiments, these materials are opaque, ridged, and light weight. Example materials include aluminum, opaque plastic, etc. Solar shield 205 may be integrated into the exterior skin or surface of fuselage 204, or alternatively, be a removeable component that clips into or otherwise mounts onto fuselage 204 to provide easy access to cooling plate 201 and/or other interior components within fuselage 204.

As mentioned above, FIGS. 2A and 2B illustrates an example VTOL, fixed wing aircraft capable of hovering, vertical ascents and descents, and efficient forward cruise that achieves aerodynamic lift. As illustrated, UAV 200 includes horizontal propulsion units 206 positioned on wing assembly 202 for propelling UAV 200 horizontally. UAV 200 further includes two boom assemblies 210 that secure to wing assembly 202. Vertical propulsion units 212 are mounted to boom assemblies 210. Vertical propulsion units 212 providing vertical propulsion. Vertical propulsion units 212 may be used during a hover mode where UAV 200 is descending (e.g., to a delivery location), ascending (e.g., at initial launch or following a delivery), or maintaining a constant altitude. Stabilizers 208 (or tails) may be included with UAV 200 to control pitch and stabilize the aerial vehicle's yaw (left or right turns) during cruise. In some embodiments, during cruise mode vertical propulsion units 212 are disabled or powered low and during hover mode horizontal propulsion units 206 are disabled or powered low.

During flight, UAV 200 may control the direction and/or speed of its movement by controlling its pitch, roll, yaw, and/or altitude. Thrust from horizontal propulsion units 206 is used to control air speed. For example, the stabilizers 208 may include one or more rudders 208a for controlling the aerial vehicle's yaw, and wing assembly 202 may include elevators for controlling the aerial vehicle's pitch and/or ailerons 202a for controlling the aerial vehicle's roll. As another example, increasing or decreasing the speed of all the propeller blades simultaneously can result in UAV 200 increasing or decreasing its altitude, respectively.

Many variations on the illustrated fixed-wing aerial vehicle are possible. For instance, aerial vehicles with more wings (e.g., an "x-wing" configuration with four wings), are also possible. Although FIGS. 2A and 2B illustrate one wing assembly 202, two boom assemblies 210, two horizontal propulsion units 206, and six vertical propulsion units 212 per boom assembly 210, it should be appreciated that other variants of UAV 200 may be implemented with more or less of these components.

It should be understood that references herein to an "unmanned" aerial vehicle or UAV can apply equally to autonomous and semi-autonomous aerial vehicles. In a fully autonomous implementation, all functionality of the aerial vehicle is automated; e.g., pre-programmed or controlled via real-time computer functionality that responds to input from various sensors and/or pre-determined information. In a semi-autonomous implementation, some functions of an aerial vehicle may be controlled by a human operator, while other functions are carried out autonomously. Further, in some embodiments, a UAV may be configured to allow a remote operator to take over functions that can otherwise be controlled autonomously by the UAV. Yet further, a given type of function may be controlled remotely at one level of abstraction and performed autonomously at another level of abstraction. For example, a remote operator may control high level navigation decisions for a UAV, such as specifying that the UAV should travel from one location to another (e.g., from a warehouse in a suburban area to a delivery address in a nearby city), while the UAV's navigation system autonomously controls more fine-grained navigation decisions, such as the specific route to take between the two locations, specific flight controls to achieve the route and avoid obstacles while navigating the route, and so on.

Figure 3A:
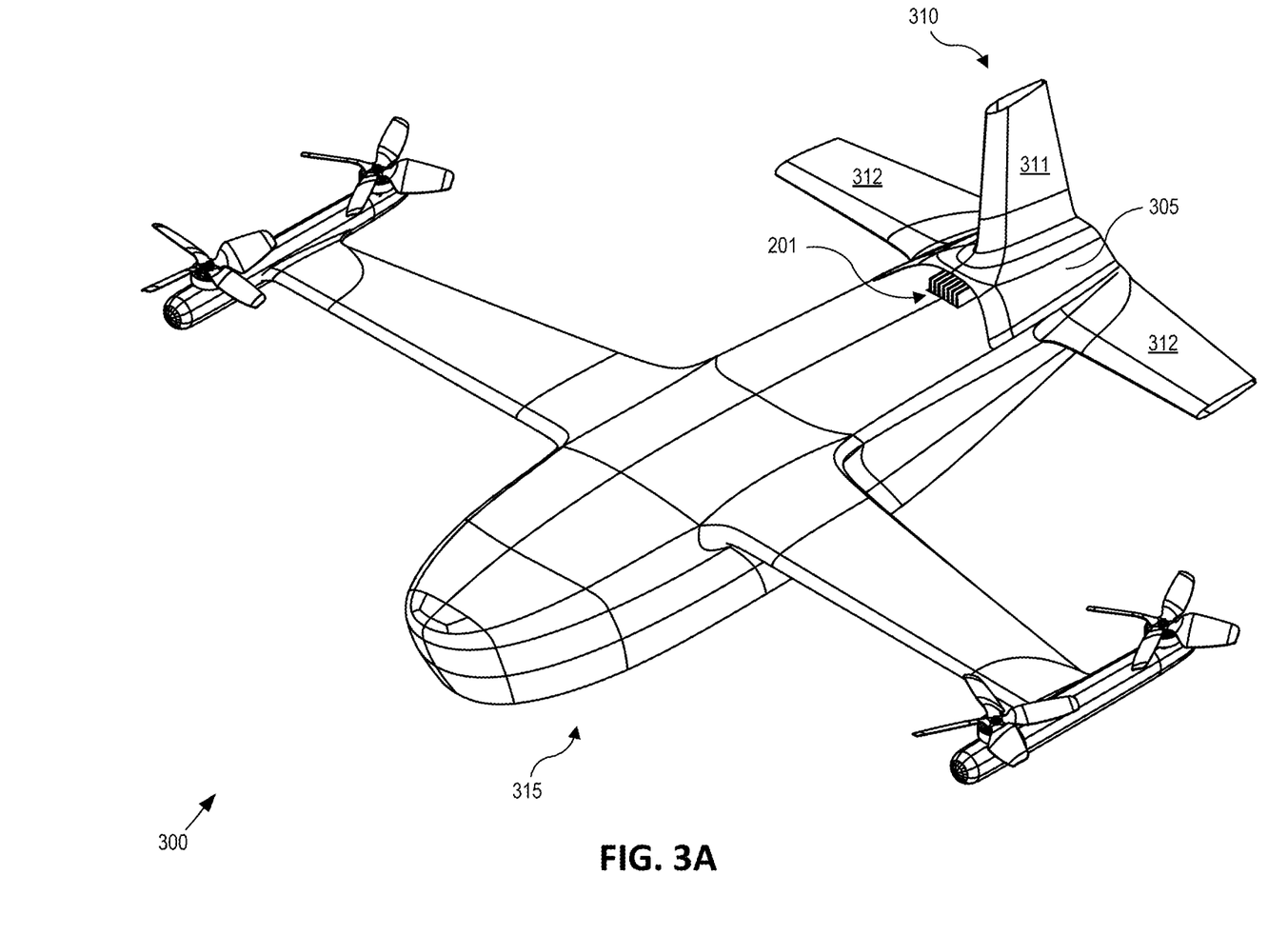
FIGS. 3A and 3B are perspective view illustrations of another UAV including a solar shield that serves as a mount that connects a tail assembly to the fuselage, in accordance with an embodiment of the disclosure.
Figure 3B:
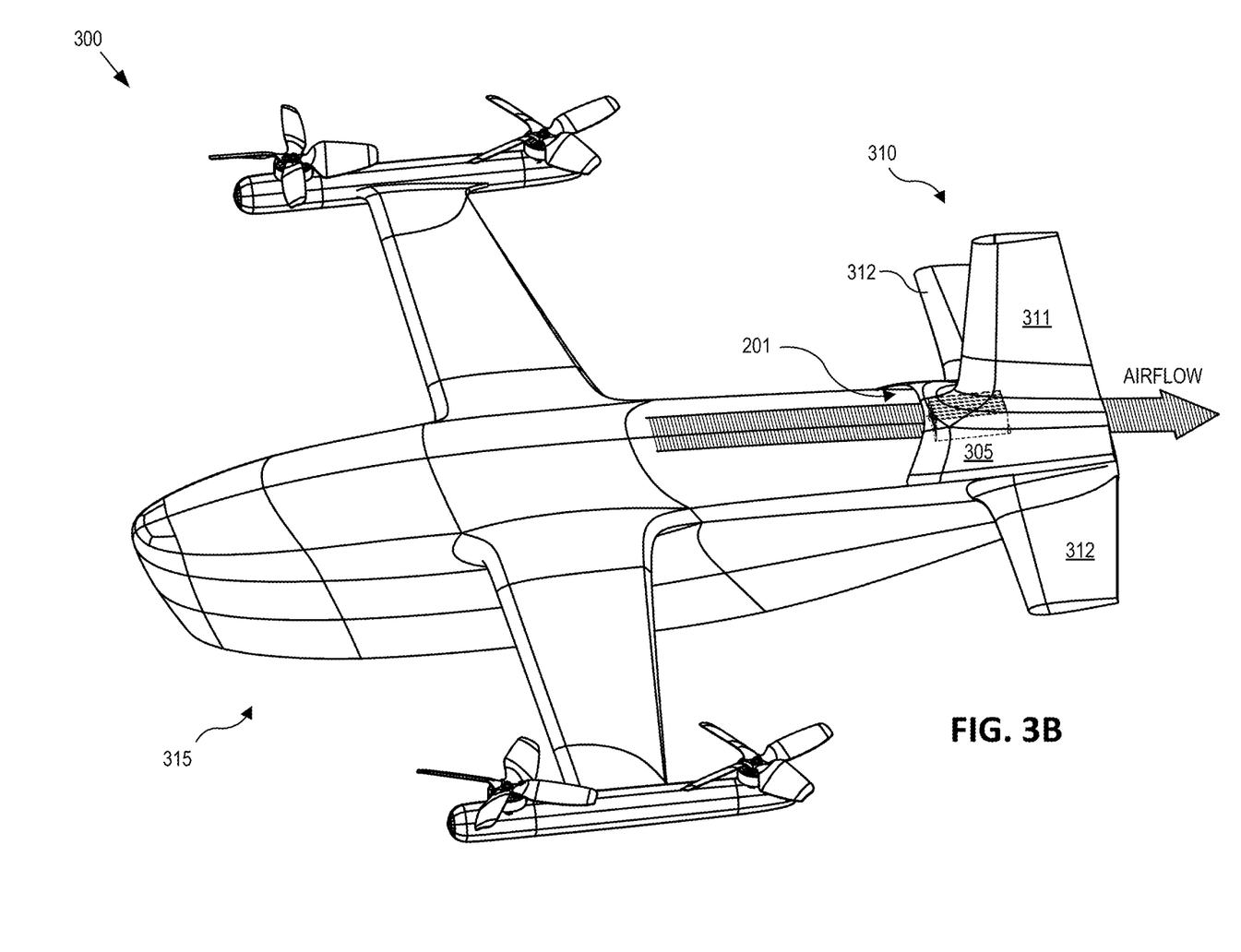

FIGS. 3A and 3B illustrate another configuration of a fixed wing UAV 300 including a solar shield 305 that serves as a mount that connects at least a portion of a tail assembly 310 to a fuselage 315, in accordance with an embodiment of the disclosure. UAV 300 illustrates yet another possible implementation of UAVs 105 that incorporate a solar shield for shading cooling plate 201.

The illustrated embodiment of tail assembly 310 includes a single vertical stabilizer 311 and dual horizontal stabilizers 312; however, it should be appreciated that tail assembly 310 may also assume a variety of other form factors any of which (or any portion of which) may be mounted to the aft section of fuselage 315 via solar shield 305 by using solar shield 305 as the mounting point or mounting bracket. For example, tail assembly 310 may include a V-tail, an inverted V, an A-tail (see FIG. 6), a conventional tail having a single vertical stabilizer flanked on either side by horizontal stabilizers (illustrated), a U-tail, an H-tail, or otherwise. In other words, solar shield 305 may serve as the mount to fuselage 315 for any combination of horizontal, vertical, or oblique tail stabilizers. In various embodiments, solar shield 305 is integrated into tail assembly 310 forming a single contiguous member with the tail assembly (or a portion of the tail assembly such as vertical stabilizer 311).

Figure 3C:
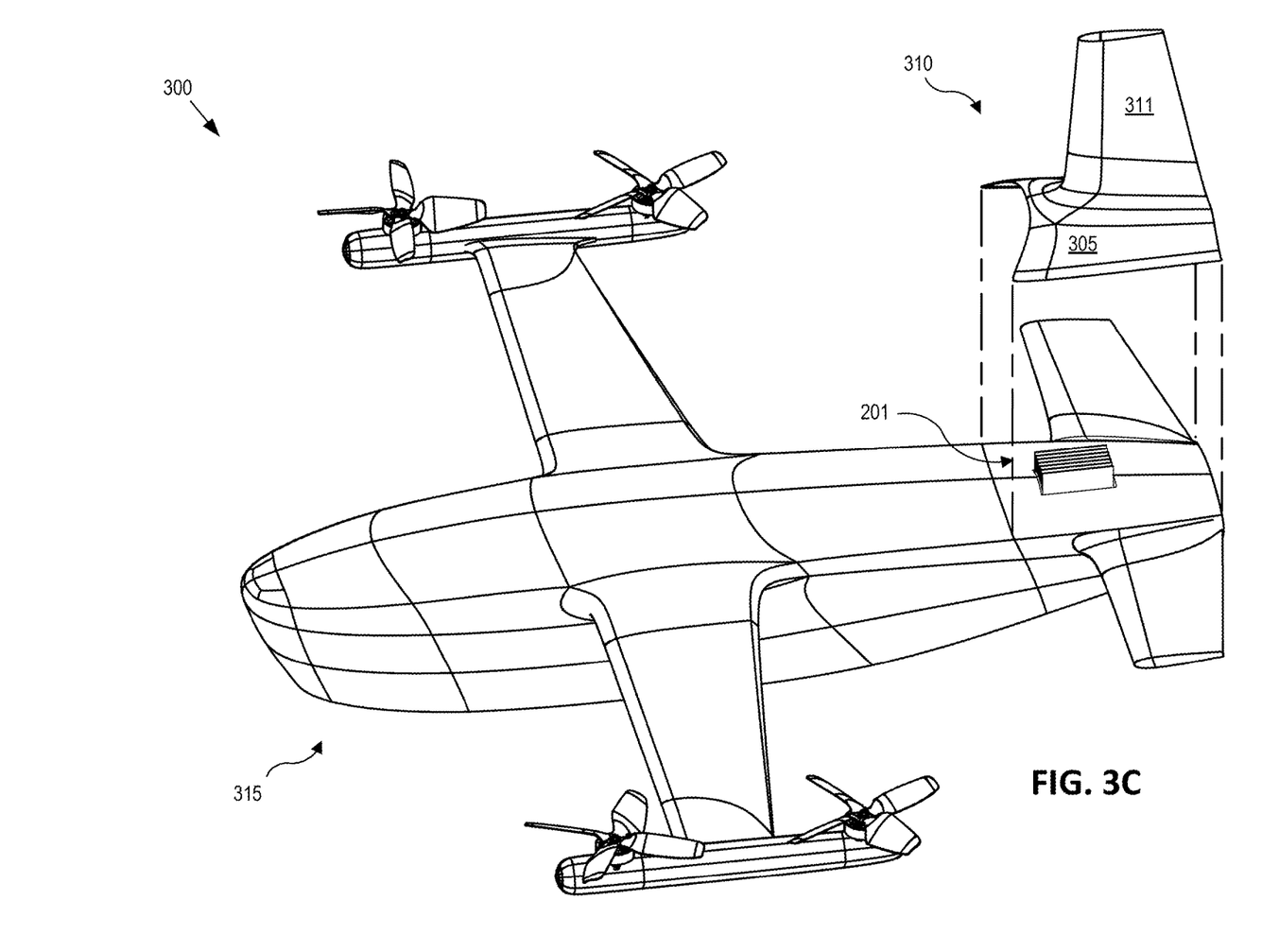
FIG. 3C illustrates how the solar shield may operate as a removeable mounting bracket that removably mounts the tail assembly to the fuselage, in accordance with an embodiment of the disclosure.

FIG. 3C illustrates how solar shield 305 may operate as a removeable mounting bracket that removably mounts tail assembly 310 (or a portion thereof) to fuselage 315, in accordance with an embodiment of the disclosure. Vertical stabilizer 311 protrudes up from the top of fuselage 315 significantly increasing the overall size and form factor of UAV 300. Leveraging solar shield 305 as a removeable mount enables vertical stabilizer 311 of tail assembly 310 to be removed and stowed for compact storage and/or transport. Solar shield 305 may removably mount to fuselage 315 using mechanical fasteners, clip-in mounts, or otherwise.

Figure 4A:
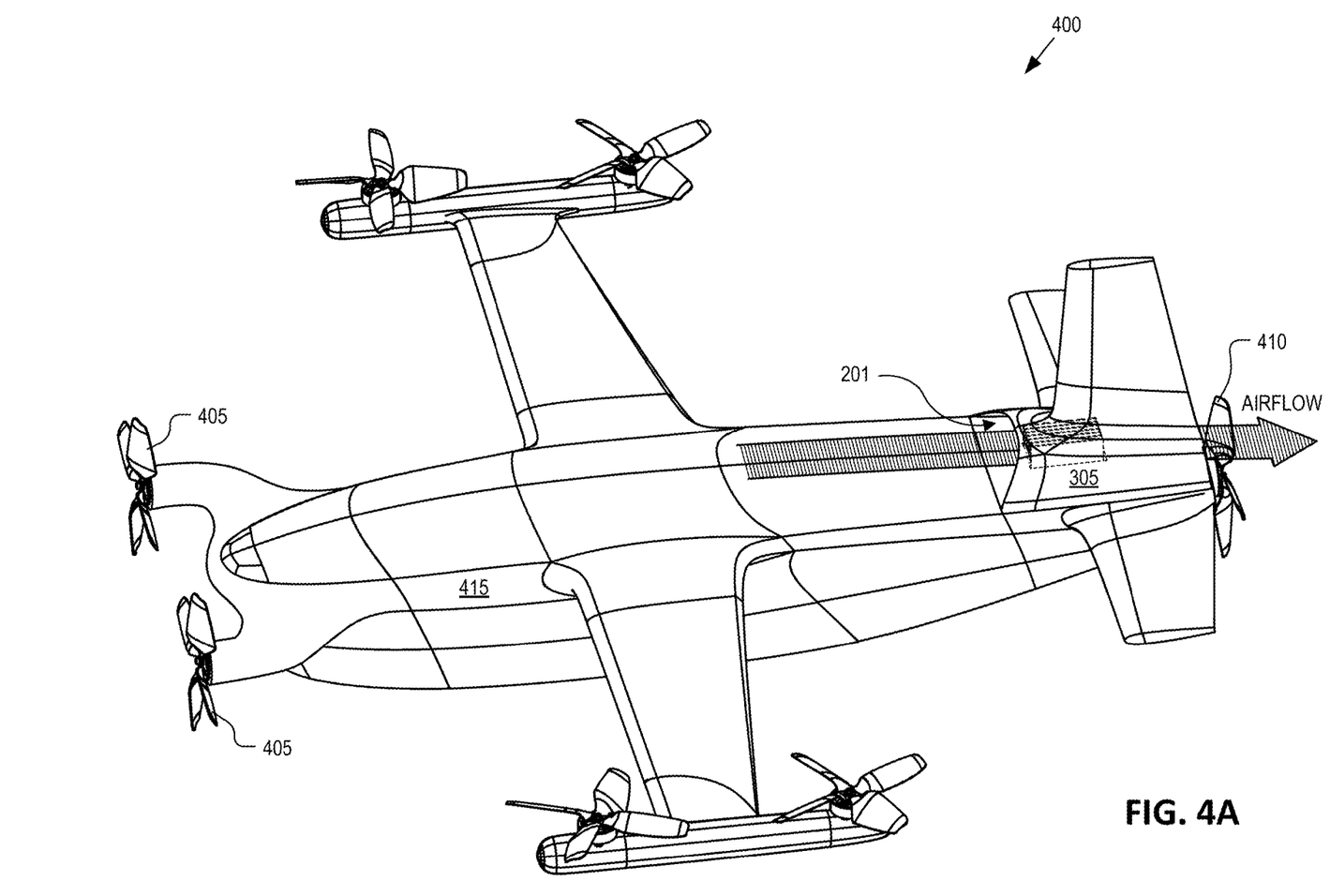
FIGS. 4A and 4B illustrate additional configurations of UAVs that mount the horizontal thrust propellers to the fuselage providing improved yaw stability along with increased airflow cooling to the cooling plate, in accordance with an embodiment of the disclosure.
Figure 4B:
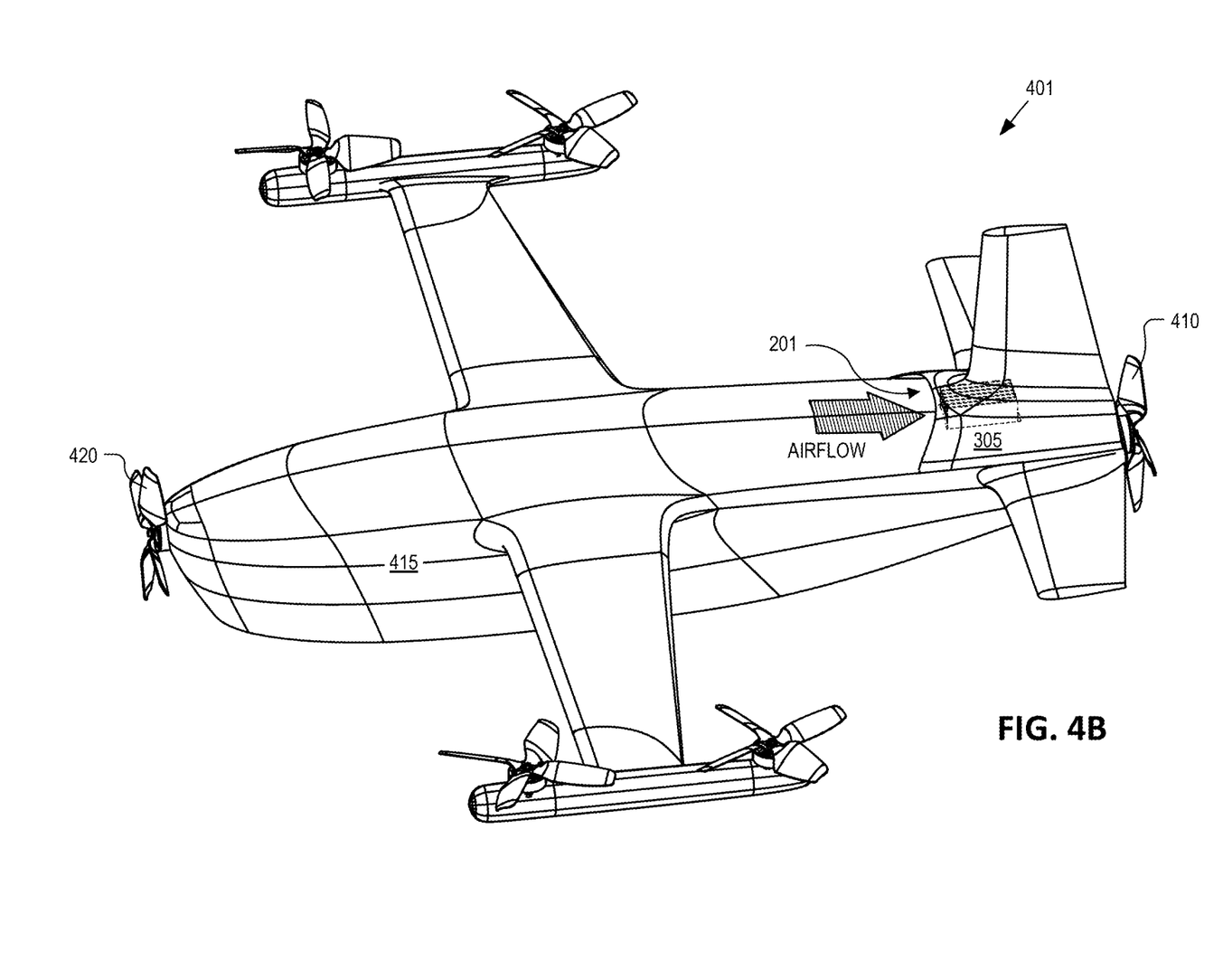

FIGS. 4A and 4B illustrate additional configurations of UAVs that mount the horizontal propulsion units to the fuselage, in accordance with an embodiment of the disclosure. For example, FIG. 4A illustrates an UAV 400 including dual nose propellers 405 and a single rear propeller 410 mounted directly to fuselage 415 to provide horizontal propulsion. Similarly, FIG. 4B illustrates an UAV 401 including a single nose propeller 420 and a single tail propeller 410 mounted directly to fuselage 415. UAVs 400 and 401 represent yet other possible implementations of UAVs 105.

Figure 5:
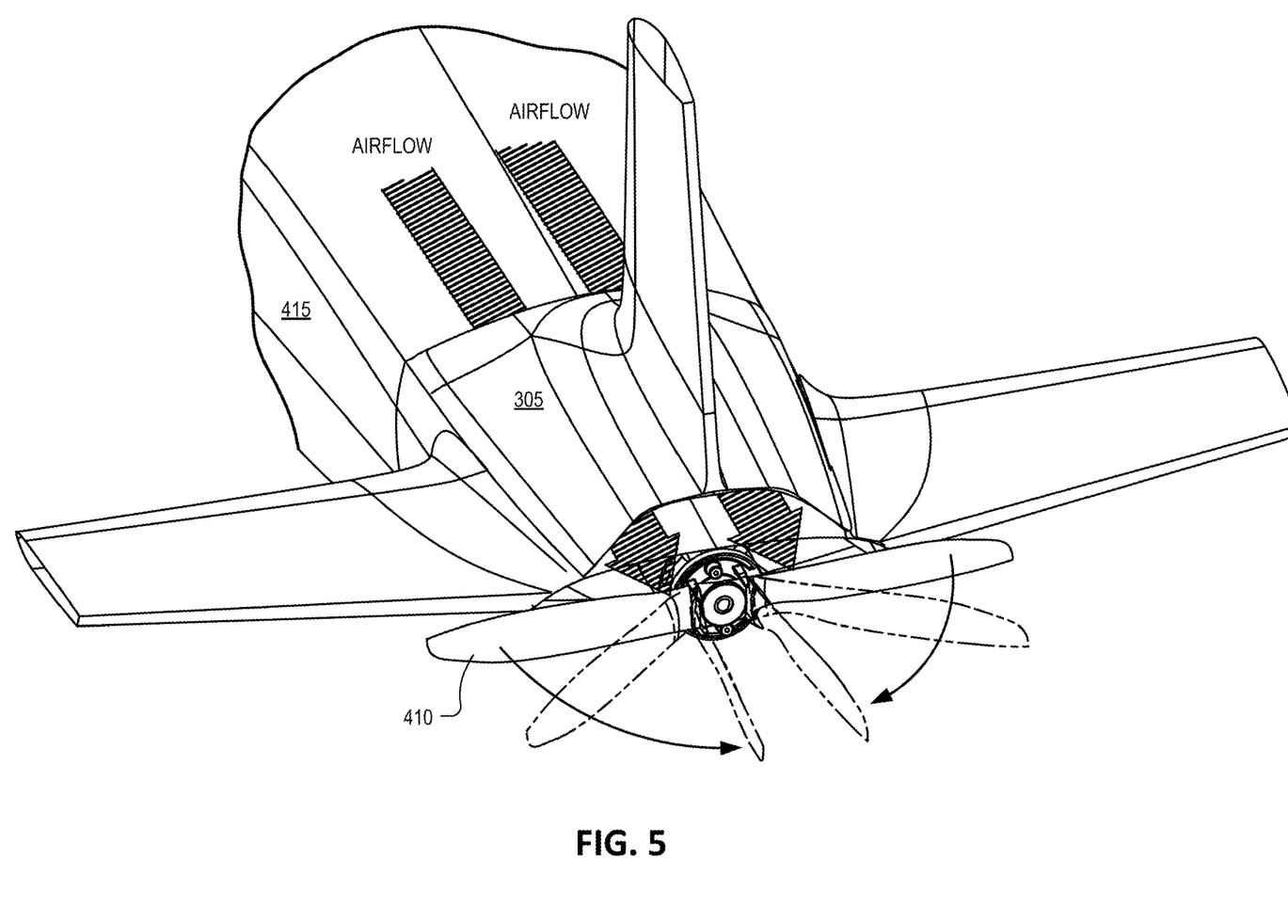
FIG. 5 illustrates how a tail propeller mounted immediately behind the air scoop can provide increased airflow for conductive cooling while spinning and fold to reduce drag when not in operation, in accordance with an embodiment of the disclosure.

Mounting the horizontal propulsion units (e.g., nose propellers 405, 420 or tail propellers 410) to fuselages 415 not only provides improved yaw stability compared to outboard horizontal propulsion units 206, but also increases airflow across cooling plate 201. In other words, a portion of the airflow generated by horizontal propulsion units is directed through the air scoop defined by solar shield 305 and across cooling plate 201. During horizontal cruise, the airflow is increased due to the thrust of the horizontal propulsion units. While UAVs 400 or 401 are parked stationary on the ground, airflow can be generated and pulled or pushed through the air scoop across cooling plate 201 using low thrust. In particular, FIG. 5 illustrates how tail propeller 410 is mounted directly inline behind the air scoop to efficiently draw airflow through the air scoop/airduct defined by solar shield 305. The position and orientation of tail propeller 410 is well suited to provide additional convective air cooling while the UAV is parked on the ground and charging. The thrust provided by tail propeller 410 may be limited to prevent movement of UAV while charging. Alternatively, nose propellers 405/420 may be driven in reverse to counteract the thrust of tail propeller 410 to maintain a stationary position while charging in the event additional cooling is desired. In other embodiments, a separate cooling fan may be integrated into the air scoop/airduct defined by solar shield 305 to provide supplemental on-demand airflow across cooling plate 201. Accordingly, UAVs 400 or 401 may include an on-board controller programmed to spin tail propeller 410 (or alternatively spin an integrated fan) to blow or draw airflow through the air scoop and across cooling plate 201 for on-demand, augmented cooling while UAVs 400 or 401 are landed and charging. FIG. 5 further illustrates how tail propeller 410 may be hinged to fold back and reduce drag when not in use (e.g., nose propeller(s) are providing forward thrust alone during cruise).

Figure 6:
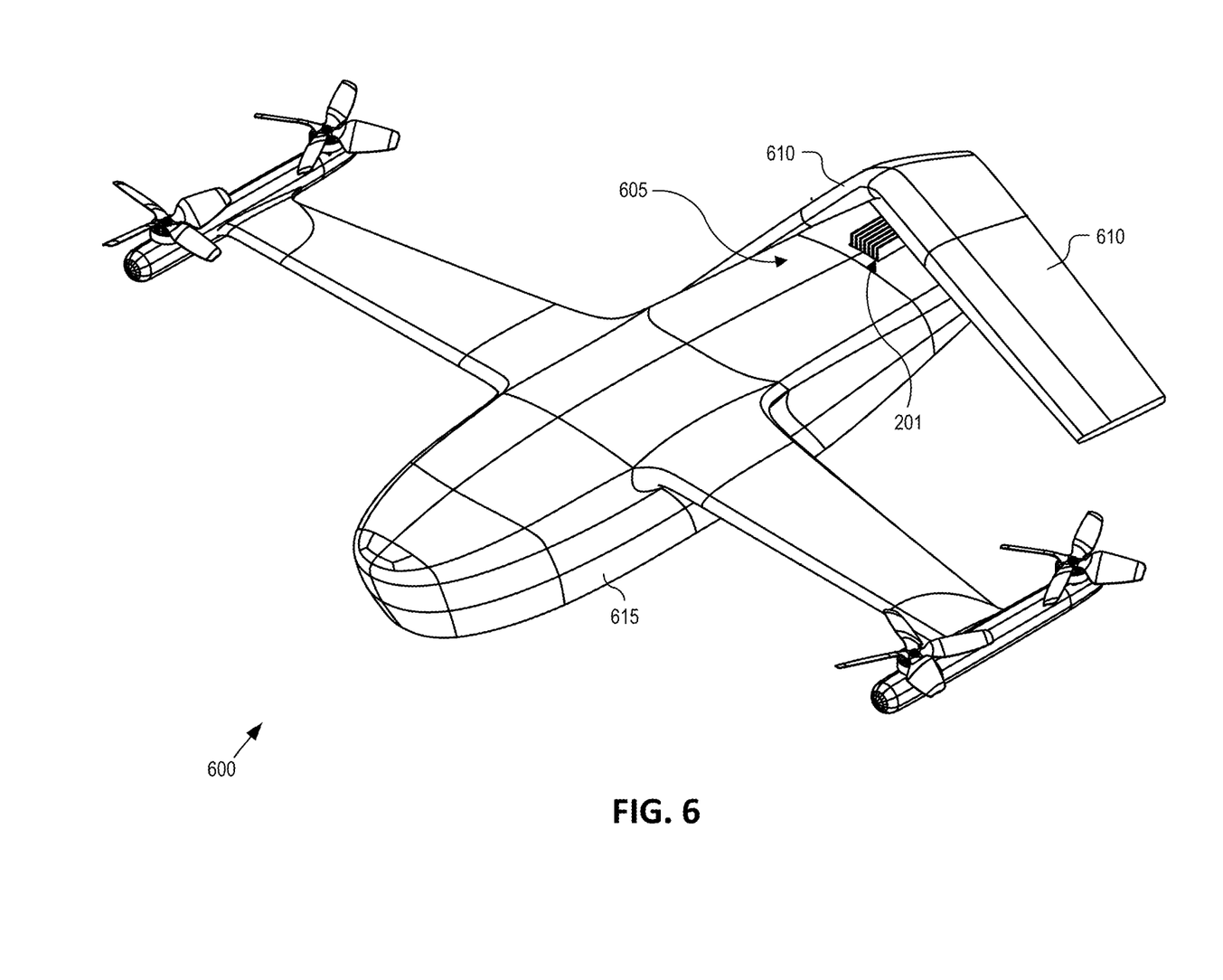
FIG. 6 is a perspective view illustration of a UAV where the solar shield and air scoop are formed by oblique stabilizers of a tail assembly having an A-Tail shape, in accordance with an embodiment of the disclosure.

FIG. 6 is a perspective view illustration of a UAV 600 where a solar shield and air scoop 605 are formed by oblique stabilizers 610 of a tail assembly having an A-Tail shape, in accordance with an embodiment of the disclosure. UAV 600 is yet another possible implementation of UAVs 105. It should be appreciated that the embodiments illustrated in FIGS. 2A, 3A, 4A, 5, and 6 are not necessarily mutually exclusive implementations, but rather the various disclosed features may be interchanged and/or used in connection with each other.

As illustrated in FIG. 6, oblique stabilizers 610 meet at an apex above fuselage 615 and slope down and out from the apex and fuselage 615. Oblique stabilizers 610 form the solar shield and define a cross-section for air scoop 605 with the exterior surface of fuselage 615. Accordingly, oblique stabilizers 610 themselves shade cooling plate 201 and direct airflow across cooling plate 201 as an air scoop.

Processes explained above may be described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An unmanned aerial vehicle (UAV), comprising:
a fuselage;
electronics disposed with the fuselage;
a heat sink thermally connected to the electronics, the heat sink including a cooling plate disposed on or extending through an exterior surface of the fuselage and exposed to an external environment of the UAV to conduct heat from the electronics to the external environment via convection; and
a solar shield extending over the cooling plate and defining an air scoop within which the cooling plate is disposed to direct airflow from the external environment along an airduct passage that passes over the cooling plate, wherein the solar shield at least partially shades the cooling plate from solar radiation incident from above the UAV,
wherein the solar shield is configured as a removeable mounting bracket that spans the heat sink and removably mounts a tail assembly including one or more stabilizers to the fuselage,
wherein the airduct passage does not include an actuated obstruction that diverts airflow exiting the airduct passage.

2. The UAV of claim 1, wherein the cooling plate is disposed on or extends through a topside surface of the fuselage.

3. The UAV of claim 2, wherein the cooling plate and the electronics are disposed in or on an aft section of the fuselage.

4. The UAV of claim 1, wherein the solar shield is integrated into the tail assembly forming a single contiguous member with the tail assembly.

5. The UAV of claim 1, further comprising:
a propeller mounted to the fuselage in line with the air scoop defined by the solar shield to blow or draw the airflow through the air scoop across the cooling plate.

6. The UAV of claim 5, wherein the propeller comprises a tail propeller mounted to a tail of the fuselage immediately behind the solar shield.

7. The UAV of claim 5, further comprising a controller disposed within the fuselage and including logic that when executed by the controller causes the UAV to perform operations comprising:
spinning the propeller to blow or draw the airflow through the air scoop across the cooling plate while the UAV is landed on a charging pad and charging a battery disposed within the fuselage to cool the electronics,
wherein the propeller is mounted to the UAV to provide horizontal propulsion to the UAV during horizontal cruise flight and a thrust of the propeller is limited during the spinning while the UAV is on the charging pad to prevent movement of the UAV while charging the UAV.

8. The UAV of claim 5, wherein the UAV comprises a vertical takeoff and landing (VTOL) fixed wing aircraft including a plurality of vertical lift rotors and a plurality of horizontal thrust propellers.

9. The UAV of claim 1, wherein the cooling plate comprises cooling fins that extend into the air scoop and align with a direction of the airflow.

10. The UAV of claim 1, wherein the solar shield is shaped to function as a clip-in mount for the tail assembly.

11. A fixed wing unmanned aerial vehicle (UAV), comprising:
a fuselage;
electronics disposed with an aft section of the fuselage;
a heat sink disposed in the aft section of the fuselage and thermally connected to the electronics, the heat sink including a cooling plate exposed from a topside of the fuselage to an external environment of the UAV to conduct heat from the electronics to the external environment via convection; and
a solar shield extending over the cooling plate and defining an air scoop within which the cooling plate is disposed to direct airflow from the external environment along an airduct passage that passes over the cooling plate, wherein the solar shield shades the cooling plate from solar radiation incident from above the fixed wing UAV to reduce solar heating of the cooling plate by the solar radiation,
wherein the solar shield is configured as a removeable mounting bracket that spans the heat sink and removably mounts a tail assembly including one or more stabilizers to the fuselage,
wherein the solar shield is integrated into the tail assembly forming a single contiguous member with the tail assembly,
wherein the airduct passage does not include an actuated obstruction that diverts airflow exiting the airduct passage.

12. The fixed wing UAV of claim 11, further comprising:
a propeller mounted to the fuselage in line with the air scoop defined by the solar shield to blow or draw the airflow through the air scoop across the cooling plate.

13. The fixed wing UAV of claim 12, wherein the propeller comprises a tail propeller mounted to a tail of the fuselage immediately behind the solar shield.

14. The fixed wing UAV of claim 12, further comprising a controller disposed within the fuselage and including logic that when executed by the controller causes the fixed wing UAV to perform operations comprising:
 spinning the propeller to blow or draw the airflow through the air scoop across the cooling plate while the fixed wing UAV is landed on a charging pad and charging a battery disposed within the fuselage,
 wherein the propeller is mounted to the fixed wing UAV to provide horizontal propulsion to the fixed wing UAV during horizontal cruise flight and a thrust of the propeller is limited during the spinning while the fixed wing UAV is on the charging pad to prevent movement of the fixed wing UAV while charging the fixed wing UAV.

\* \* \* \* \*